United States Patent [19]
Akoh et al.

[11] Patent Number: 5,472,934
[45] Date of Patent: Dec. 5, 1995

[54] ANISOTROPIC SUPERCONDUCTING DEVICE AND FLUXON DEVICE

[75] Inventors: Hiroshi Akoh; Hiroshi Sato, both of Tsukuba, Japan

[73] Assignees: Agency of Industrial Science & Technology; Ministry of International Trade & Industry, both of Tokyo, Japan

[21] Appl. No.: 210,283

[22] Filed: Mar. 18, 1994

[30] Foreign Application Priority Data

Jul. 30, 1993 [JP] Japan ..................... 5-208989

[51] Int. Cl.$^6$ .................... H01L 39/12; H01L 39/22; H01L 39/24
[52] U.S. Cl. .................... 505/190; 505/238; 505/329; 505/702; 257/31; 257/32; 257/33; 257/35
[58] Field of Search .................... 257/31, 32, 33, 257/34, 35, 36; 505/190, 238, 239, 329, 701, 702

[56] References Cited

U.S. PATENT DOCUMENTS

| | | | |
|---|---|---|---|
| 4,749,888 | 6/1988 | Sakai et al. ............... | 307/476 |
| 5,087,605 | 2/1992 | Hegde et al. ............... | 257/31 |

FOREIGN PATENT DOCUMENTS

| | | |
|---|---|---|
| 0293836 | 12/1988 | European Pat. Off. . |
| 0524862 | 1/1993 | European Pat. Off. . |
| 63-29436 | 6/1988 | Japan . |
| 1-45993 | 10/1989 | Japan . |
| 1-47026 | 10/1989 | Japan . |
| 2-19633 | 5/1990 | Japan . |
| 2-63316 | 12/1990 | Japan . |

OTHER PUBLICATIONS

Eom et al., "Growth Mechanisms and Properties at 90° Grain Boundaries in YBa$_2$Cu$_3$O$_7$ Thin Film," Phys. Rev. B, vol. 46, No. 18, Nov. 1, 1992, pp. 11902–11913.
Tsuge et al., "In–Situ Low–Temperature Growth of YBa$_2$Cu$_3$O$_{7-x}$ Films By Reactive Coevaporation," IEEE Trans. on Mag. vol. 27, No. 2, Mar. 1991, pp. 1009–1012.
Patent Abstracts, vol. 017, No. 110 (E–1329), Mar. 9, 1993, JP–A–04 293279, Oct. 16, 1992.
Superconductivity, Phys. Chem. Thecnol., vol. 3, No. 4, Apr. 1990, A. L. Vasil'ev, et al., "Electron Microscopy of YBa2Cu3O7–Delta Films", pp. 623–631.

*Primary Examiner*—Sara W. Crane
*Assistant Examiner*—Alice W. Tang
*Attorney, Agent, or Firm*—Oblon, Spivak, McClelland, Maier, & Neustadt

[57] ABSTRACT

An anisotropic superconductor junction device consisting of a lower superconducting layer and an upper superconducting layer separated by a barrier layer, in which the upper and lower superconducting layers and the barrier layer each have a (103) crystal orientation in which the c axis is arranged in the same direction at an angle of 45 degrees relative to the plane of the junction.

5 Claims, 6 Drawing Sheets

ANISOTROPIC SUPERCONDUCTING DEVICE AND FLUXON DEVICE

BACKGROUND OF THE INVENTION

1. Field of the Invention

This invention relates to a superconducting device, and more particularly to an anisotropic superconducting device that uses an oxide superconductor having a high superconduction critical temperature that exceeds the temperature of liquid nitrogen.

2. Discussion of the Background

Advances in thin film fabrication technology and high precision microfabrication technology have produced a rapid increase in research on electronic devices that use the class of oxide superconductors referred to as high-temperature superconductors, meaning superconductors that have a high superconduction critical temperature. However, there is still a lack of knowledge when it comes to computer devices, especially electronic devices used mainly for digital applications. In the case of junction type or multi-layer type devices which consist of a barrier layer formed between two superconductor layers, a stable, highly reliable device, such as a lead or niobium based Josephson switching device for use at ultralow temperatures, has not been obtained.

As junction devices that use high-temperature superconductors, there can be considered a superconductor-normal (i.e., ordinary metal) conductor-superconductor (SNS) junction device or a superconductor-insulator-superconductor (SIS) junction device. However, a problem that does not arise in the case of a conventional metallic superconductor but does arise in the case of high-temperature superconductors is that of the anisotropy of the superconductive properties (such as coherence length, magnetic field penetration depth and energy gap) produced by the crystal orientation. For example, the coherence length of a film of YBaCuO, a high-temperature oxide superconductor, is several tenths of a nanometer along the c axis and several nanometers in the Cu-O plane along which most of the superconducting electrons pass. Thus, compared to a metallic superconductor the coherence length of a high-temperature superconductor is shorter and anisotropic, and according to the accepted thinking this forms an obstacle, especially with respect to the realization of an SIS device.

A prototype SNS junction device has been fabricated consisting of upper and lower layers of YBaCuO superconductor separated by a barrier layer of PrBaCuO, which even at ultralow temperatures does not become superconductive but instead retains its semiconductive properties. While the device uses a-axis-oriented YBaCuO films in which the Cu-O planes are perpendicular to the plane of the junction, a-axis YBaCuO films have no anisotropy in the plane of the junction.

While a Josephson switching device which operates in latching mode at ultralow temperatures, such an a-axis YBaCuO/PrBaCuO/YBaCuO junction device operates in non-latching mode that can be observed in Josephson weak link devices similar to microbridge devices (that is, in principle without hysteresis characteristics), and as such can be used as an electronic function device. However, even though it may have the advantages that the use of a high-temperature superconductor provides, such as a lighter cooling burden, it does not have any major advantage over existing ultralow temperature Josephson devices in terms of operation or properties, and has drawbacks such as the magnitude of absolute critical current values.

SUMMARY AND OBJECT OF THE INVENTION

The object of the present invention is to provide an improved anisotropic superconducting device which can also contribute to reducing the size of such devices, by actively utilizing the anisotropy that has conventionally been considered a property that is disadvantageous with respect to producing high-temperature superconducting devices.

In accordance with the present invention, the above object is attained by an anisotropic superconducting junction device consisting of a lower superconducting layer (lower electrode) and an upper superconducting layer (upper electrode) separated by a barrier layer, in which each of the upper and lower superconducting layers is formed of YBaCuO in which the c axis in the (103) crystal orientation is arranged in the same direction at an angle of 45 degrees relative to the plane of the junction, and the barrier layer is formed of PrBaCuO which remains semiconductive at ultralow temperatures and in which the c axis in the (103) crystal orientation also is arranged at an angle of 45 degrees relative to the plane of the junction, in the same direction as the above. Having the c axis tilted at 45 degrees with respect to the junction plane indicates that the Cu-O planes perpendicular to the c axis in the films also are at 45 degrees to the junction plane.

The anisotropic superconducting device having the above structure is produced by the Steps of using a reactive co-evaporation method to epitaxially grow the YBaCuO lower superconducting layer on the principal {110} plane of a base layer of $SrTiO_3$ formed on a substrate, or on a substrate that is itself formed of $SrTiO_3$. The PrBaCuO barrier layer is then formed, followed by the forming of the YBaCuO upper superconducting layer, again using the reactive co-evaporation method. By following this procedure to form the lower superconducting layer, barrier layer and upper superconducting layer on the {110} surface of a $SrTiO_3$ base layer, each of the layers will be provided with a {103} crystal orientation. It is preferable to carry out the above steps as a continuous process without breaking the vacuum.

This invention also discloses a further fabrication method that employs a sputtering method. In accordance with this method in which in principle there is no limitation on the material of the base layer, the YBaCuO lower superconducting layer is sputtered onto a principal plane of an insulation base layer formed of $SrTiO_3$, or MgO, which is extensively used in this field, or any suitable material (again, this insulation base layer may be the substrate itself or an insulation layer formed on a suitable substrate), while controlling the temperature of the base layer so that the c axis in the {103} crystal orientation is tilted at an angle of 45 degrees, in a prescribed direction, relative to the plane of the insulation base layer. The barrier layer of PrBaCuO is then formed by the sputtering method while controlling the base layer temperature so that the c axis in the {103} crystal orientation is tilted at an angle of 45 degrees in the same direction as in the lower superconducting layer. The sputtering method is then used to form the upper superconducting layer of YBaCuO while controlling the temperature of the base layer to produce a {103} crystal orientation with a tilt of the c axis in the same direction. Here also, it is preferable to do this as a continuous process without breaking the vacuum. Here, "without breaking the vacuum" can be taken to mean "without exposure to the atmosphere", and does not refer to any particular degree of vacuum.

The present invention also comprises using the anisotropic superconducting device of the above structure fabricated as described as a Josephson transmission line for the movement of fluxons in a fluxon device that utilizes fluxon behavior, in which the direction of fluxon movement is parallel to the Cu-O planes in the YBaCuO superconducting and PrBaCuO barrier layers, and parallel also to the plane of the junction. With this arrangement, the Josephson transmission line length, which is the dimension along the direction of fluxon travel, can be made sufficiently smaller than the length in a conventional device, which serves to reduce device dimensions or increase the integration density when integrating a large number of Josephson transmission lines.

Further features of the invention, its nature and various advantages will be more apparent from the accompanying drawings and following detailed description of the invention.

DESCRIPTION OF THE PREFERRED EMBODIMENT

Figure 1:
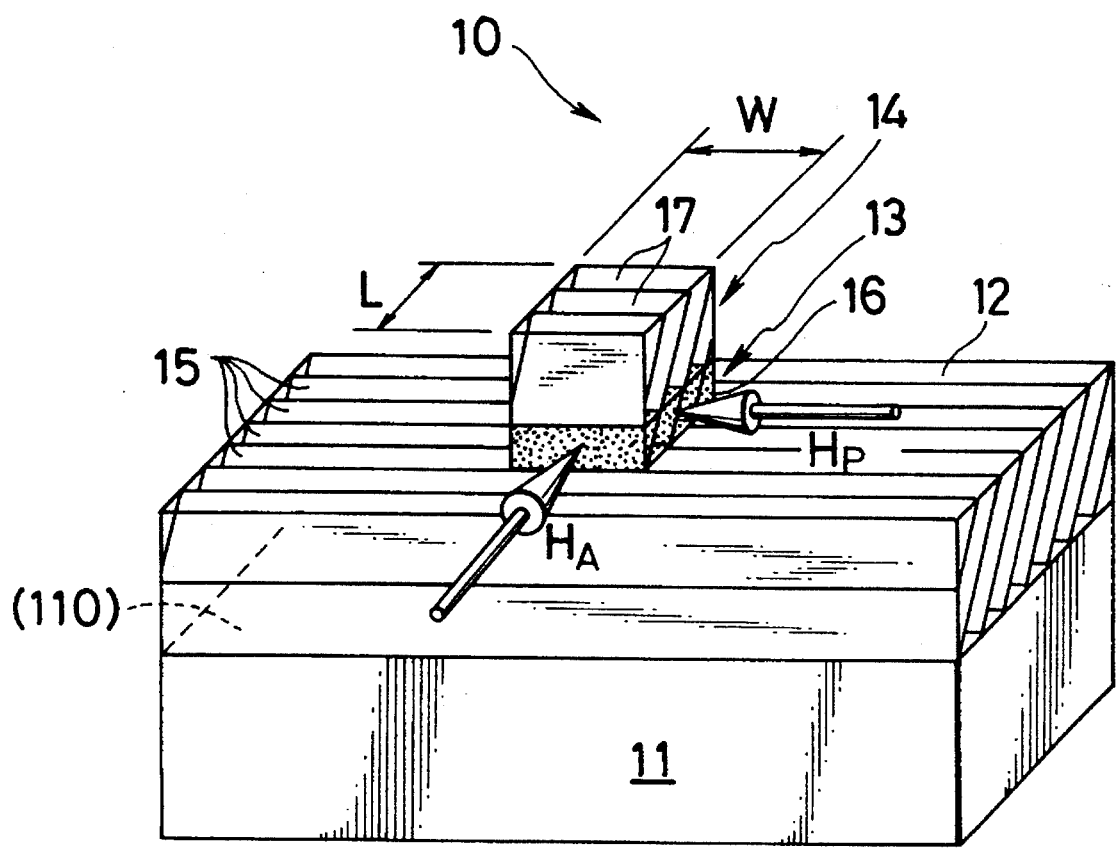
FIG. 1 shows the arrangement of the principal parts of an embodiment of the anisotropic superconducting device fabricated according to this invention.

FIG. 1 shows the structure of an embodiment of an anisotropic superconducting device 10 fabricated according to the present invention. In this embodiment, the base layer of the device is a SrTiO$_3$ substrate 11. In this embodiment, the reactive co-evaporation method is used to epitaxially grow a 140-nm-thick lower superconductor film 12 of YBaCuO on the {110} principal plane of the SrTiO$_3$ substrate 11. Under a suitable substrate temperature condition, the lower superconducting layer 12 thus grown will have a {103} crystal orientation and a c axis with a tilt of 45 degrees relative to the base layer. To indicate this, in FIG. 1 the Cu-O planes 15 (perpendicular to the c axis) in the lower superconducting layer 12 are shown angled.

Following the formation of the lower superconducting layer 12 a 45-nm-thick Josephson junction barrier layer 13 is formed of PrBaCuO, also by the reactive co-evaporation method. Under a suitable substrate temperature condition, the barrier layer 13 thus formed also has a {103} crystal orientation and inclined Cu-O planes 16, as shown in FIG. 1. Without breaking the vacuum, the reactive co-evaporation method is then again used to form a YBaCuO upper superconducting layer 14 with a thickness of about 70 nm. Under a suitable substrate temperature condition, the YBaCuO film 14 thus grown will have a {103} crystal orientation, as indicated in the drawing by the angled Cu-O planes 17.

Using the above steps to produce a multi-layer structure in a continuous sequence without breaking the vacuum reduces the risk of contamination through contact with outside air, moisture and particles, and therefore makes it possible to produce a good Josephson junction, as demonstrated hereinafter by examples of junction characteristics.

Figure 2:
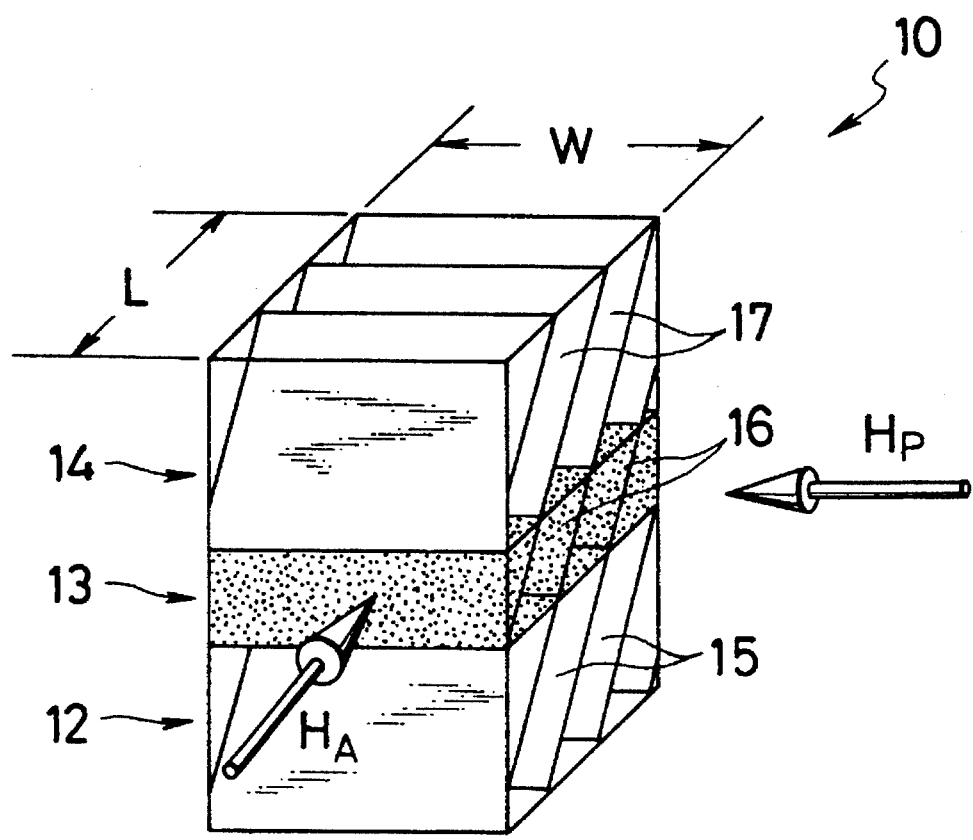
FIG. 2 shows structural unit portions of the above device.

The device is then cut to prescribed plane dimensions (of width W and length L) using a known microfabrication technique, preferable one such as liquid-nitrogen-cooled dry etching which causes little etching damage, and known Josephson device process technology is used to produce interlayer insulating films (not shown), if required, and conductive wiring layers (not shown) for the upper and lower superconducting layers 12 and 14, to thereby produce the unit device 10 in accordance with the invention. In FIG. 1 just the upper superconducting layer 14 and the barrier layer 13 are shown processed to a prescribed width and length while the large area of the lower superconducting layer 12 is retained and the layer 12 used also as a circuit layer or ground layer or the like. While this is a practicable arrangement, if necessary the lower superconducting layer 12 can also be processed to the same dimensions as the upper layers, as shown in FIG. 2.

Figure 3A:
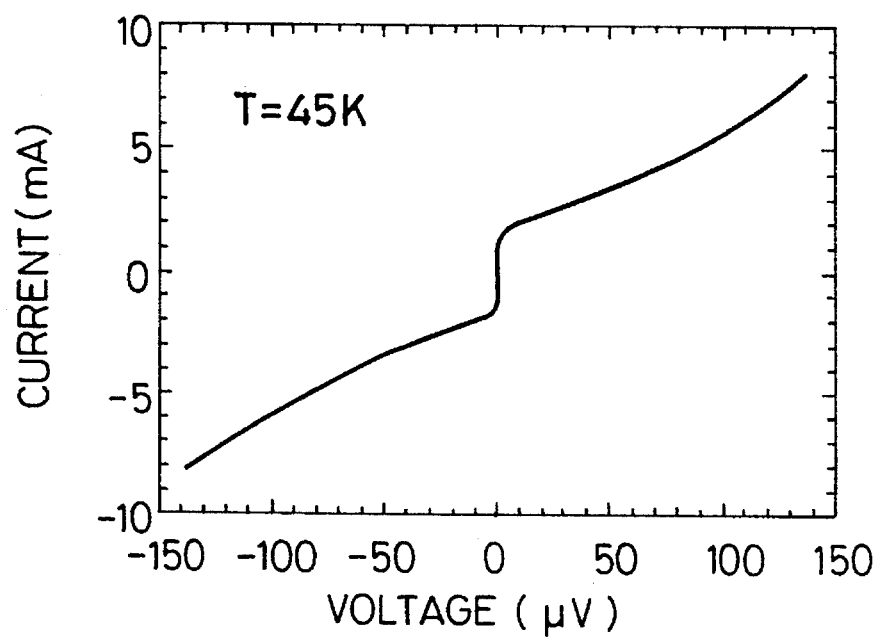
FIGS. 3A–3B show the voltage-current characteristics of an anisotropic superconducting device according to the invention.
Figure 3B:
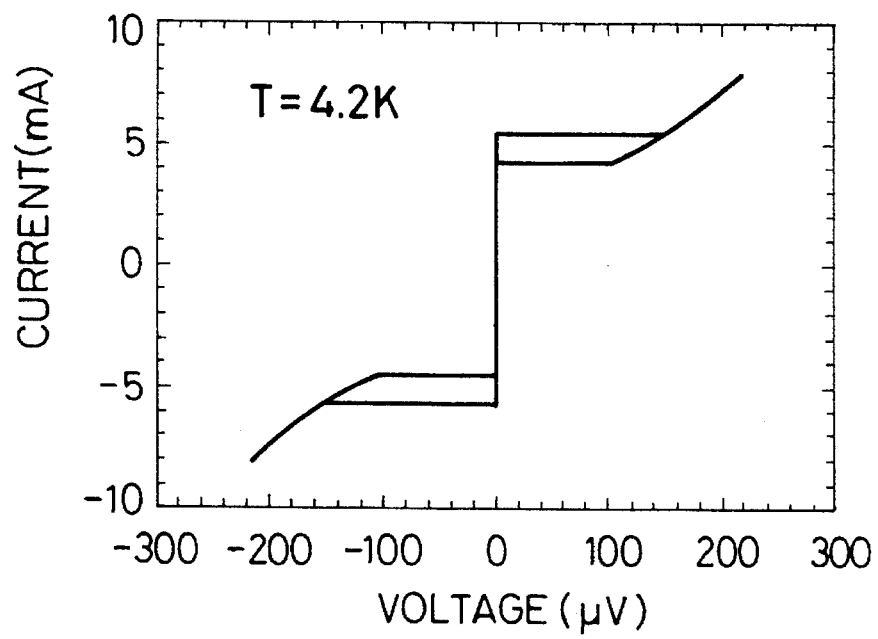

The device 10 thus fabricated has an anisotropic Josephson effect. To substantiate this, property measurements were performed on a representative device having a width and length of 30 μm each. The critical temperature Tc of a completed device 10 was 79 K. As the critical temperature Tc of the YBaCuO film prior to device fabrication was 80 to 85K, it was established that the above fabrication process reduced degradation of the superconductivity characteristics. Concerning measurement of the voltage-current characteristics, as shown by FIG. 3 (A), at an absolute temperature T of 45K the device showed non-latching characteristics, but at 4.2K, as shown by FIG. 3 (B), with the hysteresis the device operated in latching mode. While the reason for this is not clear, it indicates that the properties are fully adequate for a Josephson function device. From numerous further experiments it was found that the non-latching characteristics also appeared at higher temperature regions.

Figure 4:
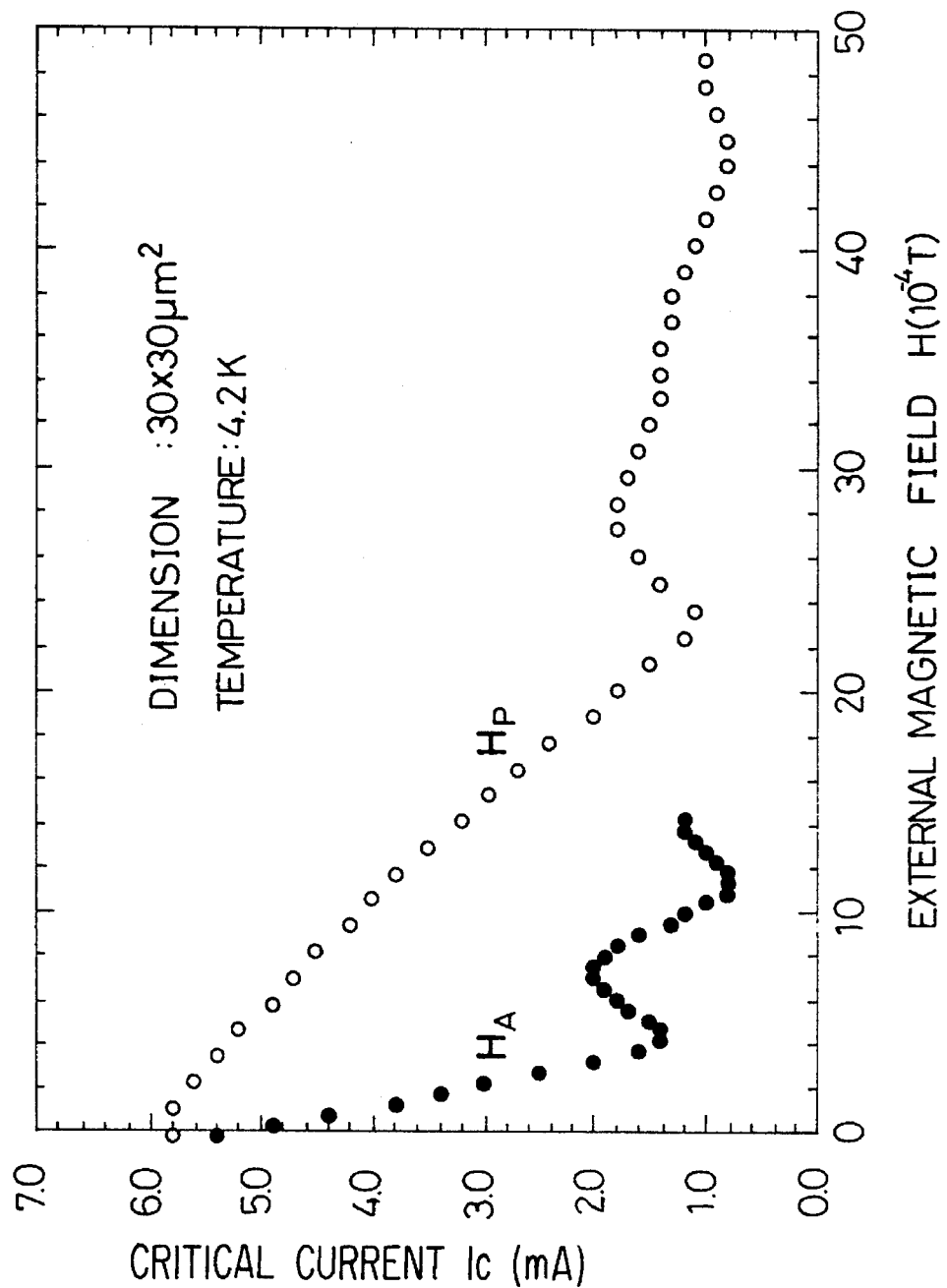
FIG. 4 shows the magnetic field dependence of the critical current in an anisotropic superconducting device according to the invention.

Next, in order to examine the dependence of the critical current $I_C$ with respect to an externally applied magnetic field, a comparison was made between a magnetic field $H_A$ applied in a direction that intersects the Cu-O planes and a magnetic field $H_P$ applied in a direction perpendicular thereto (parallel to both the Cu-O planes and to the junction plane). As shown by FIG. 4, there was a considerable difference in the characteristics thus obtained. Specifically, an increase in the strength of a magnetic field $H_A$ applied across the Cu-O planes produced a sharp drop in the critical current $I_C$, while the decrease was more moderate in the case of a magnetic field $H_P$ applied parallel to the Cu-O planes. Also as shown by FIG. 4, with respect to the Fraunhofer interference pattern produced by oscillation of the critical current $I_C$ relative to the magnetic field, arising from a dc Josephson effect, the oscillation period was longer when the magnetic field $H_P$ was applied parallel to the Cu-O planes than when it was applied perpendicular thereto.

The device thus fabricated according to this invention has an anisotropic Josephson effect which comes from the anisotropy of the magnetic field penetration depth that comes from the anisotropy of the YBaCuO crystal. Calculations of the critical magnetic field (in FIG. 4, the magnetic field at the point of zero extrapolation of critical current $I_C$) based on measured values of the anisotropic magnetic field penetration depth in YBaCuO film with a {103} orientation showed good correspondence with the experimental values.

The Josephson penetration depth $\lambda_{J1}$ in a direction perpendicular to that of the applied magnetic field $H_P$ was 1.6

μm, and the Josephson penetration depth $\lambda_{J2}$ in a direction perpendicular to that of the applied magnetic field $H_A$ was 8.1 μm, which are short enough for the 30 by 30 μm dimensions of the experimental device. This is highly desirable with respect to the arrangement of the fluxon device described below, and is a characteristic fact.

From the characteristics shown in FIGS. 3 (A) and 3 (B), it can be seen that the device of this invention is significantly usable as a Josephson device, and from FIG. 4 it is also clear that it is well endowed with various functions. For example the critical current $I_C$ varies depending on the direction of the applied magnetic field, enabling the device to be applied in various ways. It can be configured as a logic device, for example, using an individual or mutual arrangement of one or multiple magnetic coupling control lines, or as a directional magnetic sensor by mounting the device on a rotatable support member.

While the above description refers to the anisotropic superconducting device of this invention being formed by using the reactive co-evaporation method to epitaxially grow films 12, 13 and 14 on the {110} principal plane of a $SrTiO_3$ substrate 11, the device can also be fabricated by the sputtering method. In the case of the sputtering method, in principle there are no restrictions on the substrate substance, which may be $SrTiO_3$, or MgO, which is widely employed in this field, or any other suitable material. Owing to a dependency between the substrate temperature and the crystal orientation, when the sputtering method is used the temperature of the substrate is controlled to impart to the crystals of the films 12, 13 and 14 the {103} orientation required by the invention. It is again desirable that the steps of the formation process be done in a continuous procedure without breaking the vacuum, to thereby prevent possible degradation of the device. As has been mentioned, whether the reactive co-evaporation method is used, or the sputtering method, or some other method, the base layer does not have to be the substrate, and may instead be a layer or thin film formed on any suitable substrate.

Thus, the anisotropy of the superconducting device produced in accordance with this invention can be used in a diverse range of electronic capacities. One useful application is a fluxon device arrangement. Superconducting fluxon devices are known in this field of the art. The following publications contain detailed disclosures relating to the use of the fluxon principle reduced to practice in electronic devices: JP-A-63-29436, JP-A-HEI-1-45993, JP-A-HEI-1-47026, JP-A-HEI-2- 19633, and JP-A-HEI-2-63316.

Figure 5A:
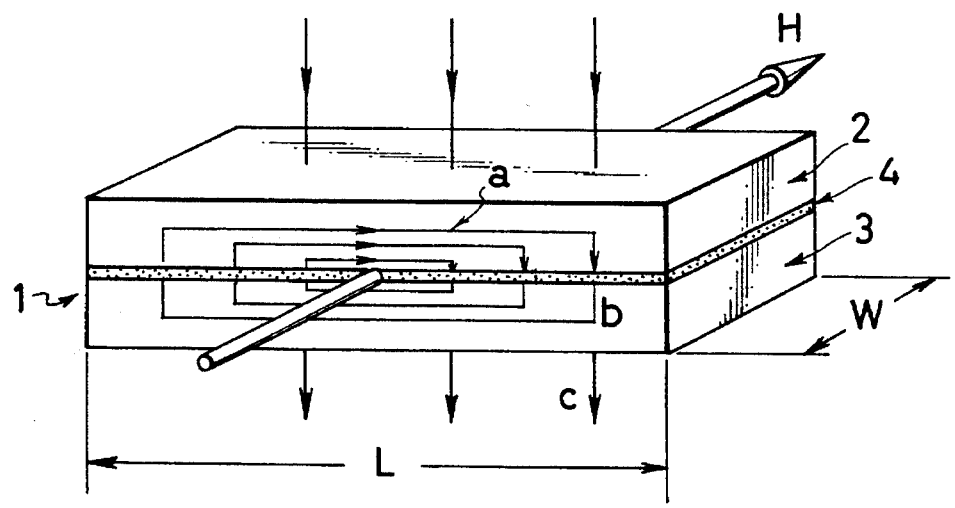
FIGS. 5A–5C illustrate a conventional superconducting fluxon device.
Figure 5B:
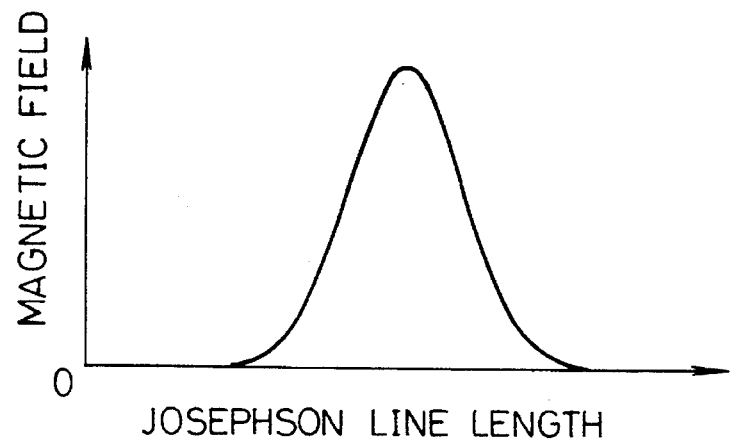
Figure 5C:
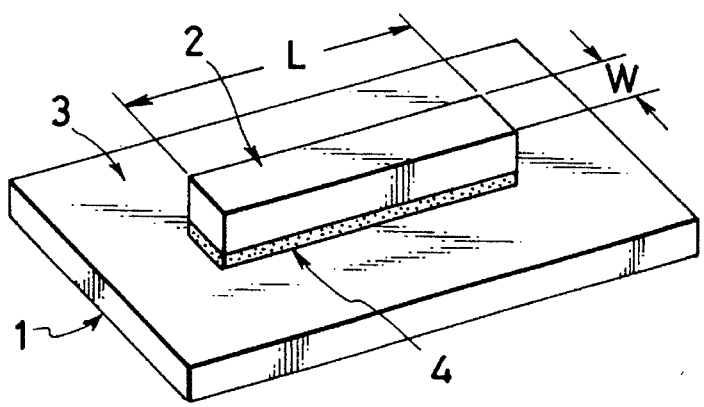

The device of this invention can be used as the Josephson transmission line of a fluxon device. Briefly, it is known that when one side of a Josephson junction is longer than Josephson penetration depth $\lambda_J$, assuming uniform conditions, an vortex current is generated in the junction that is capable of moving at high-speed. Thus, with reference to a Josephson junction 1 which, as shown by FIG. 5 (A), is comprised by a pair of superconductors 2 and 3 and a junction portion 4 and in which the length L of one side is about four times longer than a Josephson penetration depth $\lambda_J$ and the length W (line width) of the other side is less than $\lambda_J$, so that in overall terms the Josephson junction 1 has an extended length in one dimension, internally there will exist an vortex current component a, and within the component a a localized magnetic field H. In a fluxon device, such a Josephson junction 1 is termed a Josephson transmission line (and will also be referred to as such herein).

FIG. 5 (B), in which the horizontal axis represents Josephson transmission line length, shows the localized nature of the magnetic field H. The vortex current has about the same spatial spread as that of the magnetic field, about $\lambda_J$ to $4\lambda_J$. With reference to FIG. 5 (A), taking loop b as a sufficiently damped vortex current loop, the total flux passing through this loop is quantized and becomes equal to elementary flux quantum $\Phi_0$. The quantized vortex current state behaves like a single particle in the Josephson transmission line 1, and is thus termed a fluxon. The total flux equalling $\Phi_0$ corresponds to phase differential twist of just $2\pi$ in the portion where the fluxons exist. Therefore, by using a fluxon having this extremely small phase differential of $2\pi$ as an information carrier, it becomes possible to form a device that has very low power dissipation. In practice a power dissipation can be obtained that is no more than one-tenth that of a Josephson switching device operating at cryogenic temperatures.

This fluxon can move within the Josephson transmission line 1, and the voltage produced by this movement gives rise to a quasi-particle current flow and a gradual loss of energy and decline in drift speed. However, FIG. 5 (A) also shows that the fluxon can be energized and the drift speed thereby increased by applying an appropriate bias current in the direction indicated by arrow c. The upper limit of the drift speed is high, close to the speed of light in a vacuum. Because of the Lorentz force that arises between the magnetic flux and the bias current, a current applied in the opposite direction to c forms a braking current and can therefore be used to intentionally reduce the drift speed.

With reference to FIG. 5 (C), the fact that superconductor 3 has a larger area than the other superconductor does not change the properties of the Josephson transmission line 1. As shown by the dimensional relationships in FIGS. 1 and 2, the plane dimensions are set substantially by at least the dimensions of the barrier layer 4. In place of the conventional Josephson transmission line 1 shown in FIG. 5, the present invention uses the anisotropic superconducting device 10 as a Josephson transmission line, which results in different Josephson penetration depths in the transverse and longitudinal directions, with said penetration depths being short in each direction, in addition to which the Josephson penetration depth $\lambda_{J1}$ in the longitudinal direction is much shorter than the penetration depth $\lambda_{J2}$ in the width direction, making it possible to considerably reduce the line length L.

Figure 6:
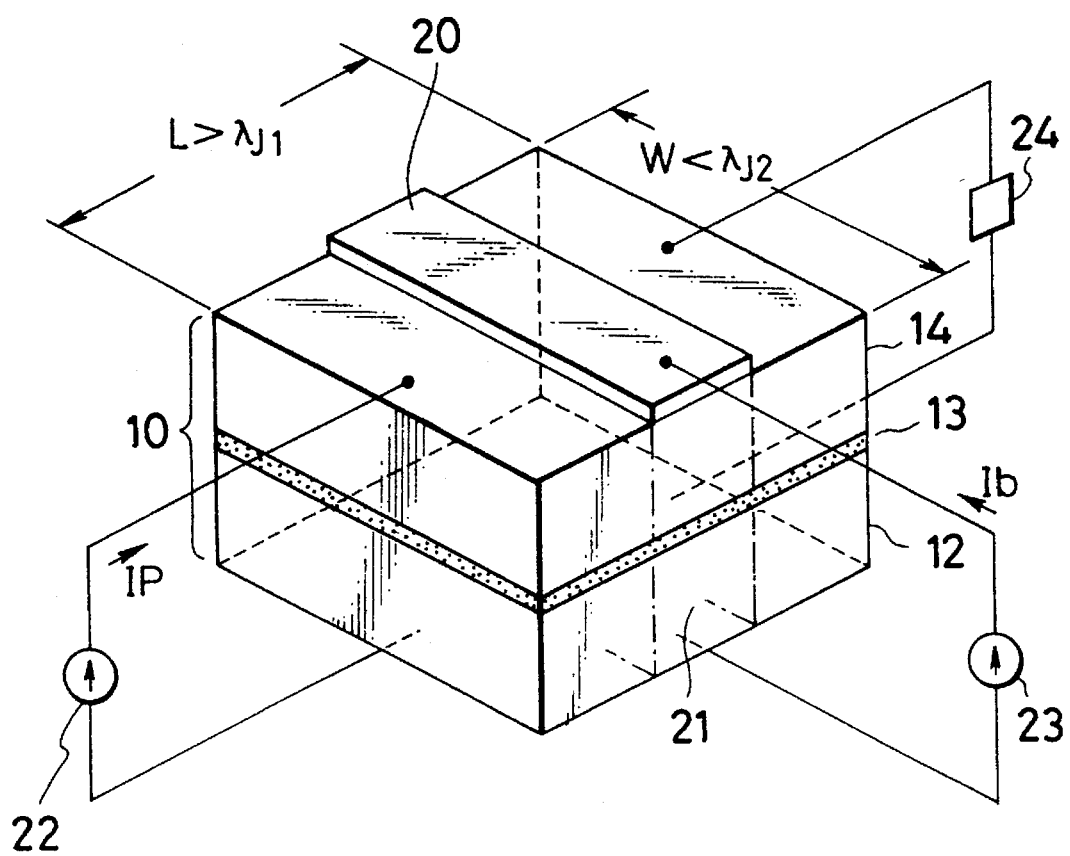
FIG. 6 illustrates an embodiment of the anisotropic superconducting device of the invention used as a fluxon device consisting of a Josephson transmission line.

FIG. 6 shows an example of the device 10 of the invention used as a Josephson transmission line in a basic arrangement widely used in conventional fluxon devices. The length L and width W can correspond to the dimensions shown in FIGS. 1 and 2, or the device may be formed as a long, plane rectangle in accordance with the above differences in the Josephson penetration depths $\lambda_{J1}$ and $\lambda_{J2}$. However, as longitudinal penetration depth $\lambda_{J1}$ has been decreased, even if the device is formed as a square that includes some extra lengthwise margin, the device can still be made much more compact than a conventional device.

Reference numeral 10 is also used to denote the Josephson transmission line constituted by the device 10. A resistance 20 is provided on the surface of one of the superconducting layers 12 and 14, midway along the length dimension; in the illustrated example the resistance 20 is provided on the upper superconducting layer 14. A current source (fluxon generator) 22 that produces a fluxon generating current IP is connected across the terminals of the superconducting layers 12 and 14 at one end of the Josephson transmission line 10 in the longitudinal direction. A generator (fluxon drive source) 23 for generating a bias current and drive current Ib is connected to a region 21 where the resistance 20 is located. An output circuit 24 provided across the superconductor terminals at the other end of the Josephson transmission line is used to output some or all fluxons to an external circuit, or to detect the arrival of the fluxons. Methods of attaching the resistance 20 and forming the resistance region 21 include those described in the listed references.

While the arrangement is not illustrated, the fluxon generator 22 may be comprised of a current generator which generates a dc bias component beforehand, and a current generator that when necessary generates current pulses to create fluxons. The latter is sometimes signal current from a first-stage circuit. The output circuit 24 may be an impedance matching circuit that is able to detect the arrival of fluxons and convert the fluxons to an electrical quantity such as current or voltage for output to an external circuit, or a set impedance arrangement to output just some of the fluxons. If it is required that if possible all of the current corresponding to arriving fluxons be delivered to an external circuit without such fluxons being reflected at the end of the Josephson transmission line 10, this can be done by setting the resistance component of the output circuit 24 to around the characteristic impedance of the line 10 and making the reactance component as small as possible. With respect to specific circuit components, the output circuit 24 can readily be configured equivalently using a resistance value that is of the same order as the line impedance and coupled to the input of the next Josephson transmission line. Details of such an arrangement are described in the listed references.

Whatever the arrangement, using the basic fluxon device configuration of FIG. 6 makes it possible to configure a programmable timer for the logic information, for example. That is, if the fluxon generator 22 is thought of as the first circuit current output and logic information transformed into current output is input to one end of the Josephson transmission line 10 to generate fluxons, after the fluxons have travelled to the resistance 20 region 21, they will lose their energy and stop. If after a desired time delay period the fluxon drive source 23 is activated to reenergize the fluxons, the fluxons will reach the output circuit 24 at the other end of the Josephson transmission line. Thus, it is possible to set a prescribed time delay before logic information that has been input is output. The velocity of the fluxons can be adjusted by adjusting the size of the drive current pulses, which makes it possible to adjust the time period between fluxon departure from the region 21 and fluxon arrival detection by the output circuit 24.

The device of FIG. 6 can also be configured as a destructive read-out memory, with the region 21 corresponding to the memory portion, the fluxon generator 22 corresponding to the data write portion, the fluxon drive source 23 corresponding to the data read-out instruction portion and the output circuit 24 corresponding to the data read-out portion, and using a fluxon that has stopped at the region 21 to represent a logical "1" or "0". In principle such a destructive read-out memory would have an extremely low power dissipation and a very good space factor, making it ideal for high-density integration.

The basic device structure shown in FIG. 6 can be applied as a Josephson transmission line to any of the fluxon devices disclosed in the cited references, and devices thus using this structure can be made smaller than conventional devices that do not use an anisotropic Josephson transmission line.

Thus, the present invention provides an effective high-temperature superconducting device and, by also providing a device that can actively utilize anisotropic Josephson characteristics, makes it possible to produce various functional devices. In addition to the long magnetic-field penetration depth possessed by high-temperature superconductors, with the anisotropic device of the invention there is a further increase in the magnetic-field penetration depth in the longitudinal direction (or a shorter depth, in terms of the Josephson penetration depth), so that applying the structure and operating principle to fluxon devices and other existing devices so that the device of this invention forms Josephson transmission lines in such devices, the devices can be made smaller and more densely integrated.

Japanese Patent Application No. 5-208989 filed Jul. 30, 1993 is hereby incorporated by reference.

What is claimed is:

1. An anisotropic multi-layered superconductor junction device having a multi-layered Josephson junction, comprising:

a crystalline lower superconducting layer of YBaCuO having a lower layer crystal c axis;

a crystalline upper superconducting layer of YBaCuO having an upper layer crystal c axis;

a crystalline middle semiconductive barrier layer of PrBaCuO disposed between and in contact with the lower superconducting layer and the upper superconducting layer and having a middle layer crystal c axis;

wherein the lower layer crystal c axis, middle layer crystal c axis, and upper layer crystal c axis, are all parallel to one another and at a 45 degree angle relative to the barrier layer of PrBaCuO.

2. An anisotropic multi-layered superconductor junction device having a multi-layered Josephson junction, comprising:

a lower superconducting layer and an upper superconducting layer of YBaCuO with a crystal orientation in which a c axis is arranged in a same direction at an angle of 45 degrees relative to a junction plane of said multi-layered Josephson junction; and a semiconductive barrier layer of PrBaCuO disposed between the lower and upper superconducting layers, said barrier layer having a crystal orientation in which a c axis is arranged at an angle of 45 degrees relative to said junction plane, in a direction that is the same as the c axis direction of said lower superconducting layer.

3. An anisotropic multi-layered superconducting device having a multi-layered Josephson junction and used as a Josephson transmission line for fluxon movement in a fluxon device, comprising:

a lower superconducting layer and an upper superconducting layer of YBaCuO with a crystal orientation in which a c axis is arranged in a same direction at an angle of 45 degrees relative to a junction plane of said multi-layered Josephson junction; and a semiconductive barrier layer of PrBaCuO disposed between the lower and upper superconducting layers, said barrier having a crystal orientation in which a c axis is arranged at an angle of 45 degrees relative to the junction plane of said multi-layered Josephson junction, in a direction that is the same as the c axis direction of said lower superconducting layer;

wherein a direction of fluxon movement is parallel to Cu-O planes of the YBaCuO upper and lower superconducting layers and PrBaCuO barrier layer, and is also parallel to said junction plane.

4. An anisotropic multi-layered superconducting device having a multi-layered Josephson junction and used as a Josephson transmission line for fluxon movement in a fluxon device, comprising:

a crystalline lower superconducting layer of YBaCuO having a lower layer crystal c axis;

a crystalline upper superconducting layer of YBaCuO having an upper layer crystal c axis;

a crystalline middle semiconductive barrier layer of PrBaCuO disposed between and in contact with the lower superconducting layer and the upper superconducting layer and having a middle layer crystal c axis;

wherein the lower layer crystal c axis, middle layer crystal c axis, and upper layer crystal c axis, are all parallel to one another and at a 45 degree angle relative to the barrier layer of PrBaCuO.

wherein a direction of fluxon movement is
   (1) parallel to Cu-O planes of the YBaCuO superconducting layers and of the PrBaCuO barrier layer and
   (2) parallel to said barrier layer.

5. The device according to claim 4, further comprising means for applying a bias current perpendicular to the YBaCuO layers.

* * * * *